United States Patent
McNeil

(10) Patent No.: US 10,794,701 B2
(45) Date of Patent: *Oct. 6, 2020

(54) INERTIAL SENSOR WITH SINGLE PROOF MASS AND MULTIPLE SENSE AXIS CAPABILITY

(71) Applicant: NXP USA, Inc., Austin, TX (US)

(72) Inventor: Andrew C. McNeil, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 275 days.

This patent is subject to a terminal disclaimer.

(21) Appl. No.: 15/967,800

(22) Filed: May 1, 2018

(65) Prior Publication Data

US 2019/0339078 A1    Nov. 7, 2019

(51) Int. Cl.
*G01C 19/5712* (2012.01)

(52) U.S. Cl.
CPC .............................. *G01C 19/5712* (2013.01)

(58) Field of Classification Search
CPC ... G01P 2015/0822; G01P 2015/08025; G01P 2015/08028; G01P 2015/0828; G01P 2015/08031; G01P 2015/08034; G01P 2015/0837; G01P 2015/084; G01P 2015/0808; G01P 2015/082; G01P 2015/0805; G01P 15/125; G01P 2015/0848; G01P 2015/0845; G01C 19/5712

See application file for complete search history.

(56) References Cited

U.S. PATENT DOCUMENTS

| | | | |
|---|---|---|---|
| 6,105,428 A | 8/2000 | Schmiesing et al. | |
| 6,845,670 B1 | 1/2005 | McNeil et al. | |
| 8,413,509 B2 * | 4/2013 | Geisberger | G01P 15/125 |
| | | | 73/514.32 |
| 9,360,496 B2 | 6/2016 | Naumann | |
| 2002/0118911 A1 | 8/2002 | Bourgeois et al. | |

(Continued)

FOREIGN PATENT DOCUMENTS

| | | |
|---|---|---|
| DE | 102009000729 A1 | 8/2010 |
| DE | 102016203092 A1 | 5/2017 |

OTHER PUBLICATIONS

U.S. Appl. No. 15/967,723, not yet published; 33 pages (May 1, 2018).

(Continued)

*Primary Examiner* — Robert R Raevis
(74) *Attorney, Agent, or Firm* — Charlene R. Jacobsen

(57) ABSTRACT

An inertial sensor includes a movable element having a mass that is asymmetric relative to a rotational axis and anchors attached to the substrate. First and second spring systems are spaced apart from the surface of the substrate. Each of the first and second spring systems includes a pair of beams, a center flexure interposed between the beams, and a pair of end flexures. One of the end flexures is interconnected between one of the beams and one of the anchors and the other end flexure is interconnected between one of the beams and the movable element. The beams are resistant to deformation relative to the center flexure and the end flexures. The first and second spring systems facilitate rotational motion of the movable element about the rotational axis and the spring systems facilitate translational motion of the movable element substantially parallel to the surface of the substrate.

20 Claims, 5 Drawing Sheets

(56) References Cited

U.S. PATENT DOCUMENTS

| | | |
|---|---|---|
| 2004/0187592 A1 | 9/2004 | Sugiura |
| 2008/0196502 A1 | 8/2008 | Fukuda et al. |
| 2012/0018624 A1 | 1/2012 | Baba et al. |
| 2013/0180332 A1 | 7/2013 | Jia et al. |
| 2015/0239731 A1 | 8/2015 | Ahtee et al. |
| 2016/0131552 A1 | 5/2016 | Naumann |
| 2016/0264401 A1 | 9/2016 | Liukku et al. |
| 2018/0180419 A1* | 6/2018 | Geisberger ......... G01C 19/5747 |

OTHER PUBLICATIONS

Non-Final Office Action for U.S. Appl. No. 15/967,723; 10 pages (Jan. 21, 2020).

Notice of Allowance; U.S. Appl. No. 15/967,723; 7 pages (May 22, 2020).

* cited by examiner

INERTIAL SENSOR WITH SINGLE PROOF MASS AND MULTIPLE SENSE AXIS CAPABILITY

TECHNICAL FIELD OF THE INVENTION

The present invention relates generally to microelectromechanical systems (MEMS) devices. More specifically, the present invention relates to a three-axis MEMS accelerometer having a single proof mass.

BACKGROUND OF THE INVENTION

Microelectromechanical systems (MEMS) technology provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One example of a MEMS inertial sensor is a MEMS accelerometer. MEMS accelerometers are sensitive to acceleration and may be configured to sense acceleration forces along one, two, or three axes or directions. One common form of MEMS accelerometer uses one or more movable structures that move under acceleration above a substrate. The movement of the movable structure changes capacitance, and an electrical circuit connected to the MEMS accelerometer structure measures the change in capacitance to determine the acceleration forces.

In order to sense motion along multiple axes, MEMS accelerometers may include multiple movable structures that move independently of one another in response to accelerations. As these devices continue to shrink in size, it becomes desirable to reduce the collective size of these movable structures. But reducing the collective size of the movable structures can make it increasingly difficult to meet predetermined sensitivity, linearity, and reliability requirements. In addition, due to smaller sizes and travel distances of the movable structures, some MEMS accelerometers may have insufficient restoring force and can therefore be vulnerable to damage from high impact loads.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Embodiments of the present invention entail microelectromechanical systems (MEMS) inertial sensor devices with small form factors, enhanced reliability, and/or improved linearity. These MEMS inertial sensor devices can include transducers such as MEMS accelerometers. More particularly, embodiments described herein entail MEMS accelerometer devices capable of sensing acceleration in three orthogonal directions (e.g., X-direction, Y-direction, and Z-direction) defined by three orthogonal axes (e.g., X-axis, Y-axis, and Z-axis). In general, the embodiments described herein can provide relatively small device size by facilitating the sharing of a single proof mass for sensing in all three directions. Furthermore, the embodiments described herein can provide this relatively small device size while still yielding improvements in linearity and restoring force when subjected to high impact loads. These improvements can be provided by the use of spring systems having useful spring constants in each of three orthogonal directions and having enhanced Z-axis translational stiffness.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
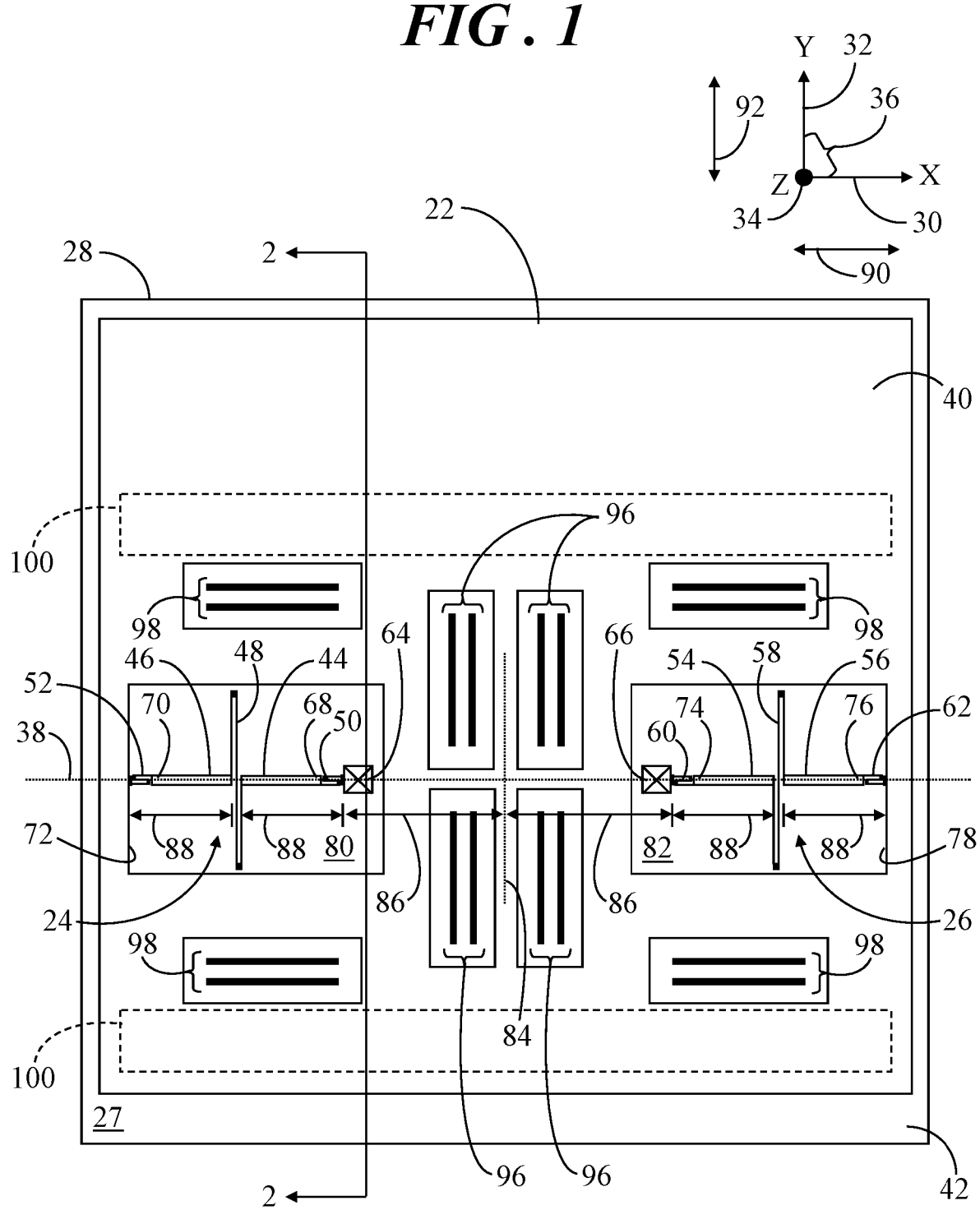
FIG. 1 shows a schematic top view of a microelectromechanical systems (MEMS) inertial sensor in accordance with an exemplary embodiment.
Figure 2:
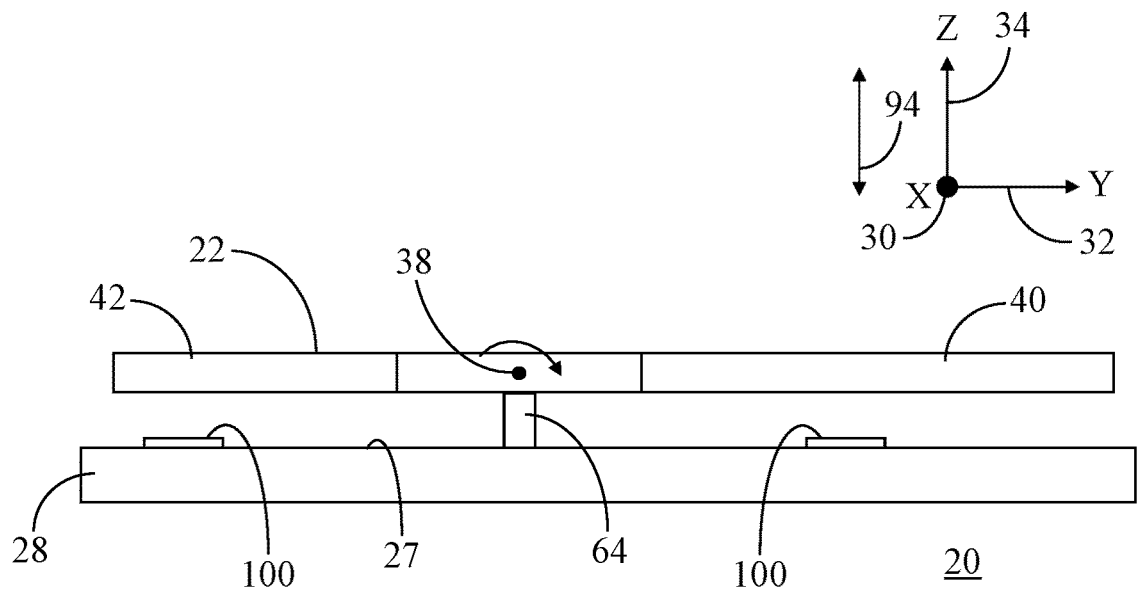
FIG. 2 shows a cross-sectional side view of the MEMS inertial sensor along section lines 2-2 of FIG. 1.

Referring to FIGS. 1 and 2, FIG. 1 shows a schematic top view of a MEMS inertial sensor 20 in accordance with an exemplary embodiment and FIG. 2 shows a cross-sectional side view of inertial sensor 20 along section lines 2-2 of FIG. 1. MEMS inertial sensor 20 generally includes a movable element, referred to herein as a proof mass 22, and first and second spring systems 24, 26 spaced apart from and configured to movably couple proof mass 22 to a surface 27 of a substrate 28.

In the top view illustration of FIG. 1, a three-dimensional coordinate system is represented in which an X-axis 30 is directed rightward and leftward on the page, a Y-axis 32 is directed upward and downward on the page, and a Z-axis 34 is directed into the page. Correspondingly, in the side view illustration of FIG. 2, the three-dimensional coordinate system is represented in which X-axis 30 is directed into the page, Y-axis 32 is directed rightward and leftward on the page, and Z-axis 34 is directed upward and downward on the page. Together, X-axis 28 and Y-axis 30 define an X-Y plane 36, and surface 27 of substrate 28 is generally parallel to X-Y plane 36.

As will be discussed in significantly greater detail below, first and second spring systems 24, 26 enable translational motion of proof mass 22 in response to acceleration forces in directions that are substantially parallel to either of X-axis 30 and Y-axis 32. Additionally, proof mass 22 has asymmetric mass relative to a rotational axis 38. That is, a first portion 40 and a second portion 42 of proof mass 22 are disposed on opposing sides of rotational axis 38. In the illustrated embodiment, first portion 40 of proof mass 22 has greater mass than second portion 42. This can be accomplished, in some embodiments, by offsetting rotational axis 38 away from a geometric center of proof mass 22. Accordingly, first and second spring systems 24, 26 further enable rotational motion of proof mass 22 about rotational axis 38 in response to acceleration force in a direction that is substantially parallel to Z-axis 34.

First spring system 24 includes a first beam 44, a second beam 46, a first center flexure 48, a first end flexure 50, and a second end flexure 52. First center flexure 48 is interposed between and connected to each of first and second beams 44, 46. In an embodiment, first and second beams 44, 46 of first spring system 24 are resistant to deformation relative to first center flexure 48 and relative to first and second end flexures 50, 52. Likewise, second spring system 26 includes a third beam 54, a fourth beam 56, a second center flexure 58, a third end flexure 60, and a fourth end flexure 62. Third and fourth beams 54, 56 of second spring system 26 are also resistant to deformation relative to second center flexure 58 and relative to third and fourth end flexures 60, 62. The terms "first," "second," "third," "fourth," and so on used herein do not refer to a sequential ordering or prioritization of the elements of MEMS inertial sensor 20. Instead, the terms "first," "second," "third," "fourth," and so on are used to distinguish the various elements from one another for clarity of description.

Inertial sensor 20 further comprises first and second anchors 64, 66, respectively, attached to substrate 28. More particularly, first and second anchors 64, 66 are coupled to substrate 28 at rotational axis 38 for proof mass 22. First end flexure 50 of first spring system 24 is interconnected between a first beam end 68 of first beam 44 and first anchor 64, and second end flexure 52 is interconnected between a second beam end 70 of second beam 46 and a first edge 72 of proof mass 22. Additionally, third end flexure 60 of second spring system 26 is interconnected between a third beam end 74 of third beam 54 and second anchor 66, and fourth end flexure 62 is interconnected between a fourth beam end 76 of fourth beam 56 and a second edge 78 of proof mass 22.

In the illustrated configuration, a first opening 80 extends through proof mass 22 in which first spring system 24 is located and a second opening 82 extends through proof mass 22 in which second spring system 26 is located. Thus, first edge 72 of proof mass 22 is at a perimeter of first opening 80 and second edge 78 of proof mass 22 is at a perimeter of second opening 82. In addition, first and second spring systems 24, 26 may be oriented in mirror symmetry relative to one another within the respective first and second openings 80, 82 of proof mass 22. Further, first and second spring systems 24, 26 may be laterally disposed on opposing sides of a midline 84 of proof mass 22 (in which midline 84 is parallel to Y-axis 32) by an equivalent distance 86. Still further, first and second beams 44, 46 of first spring system 24 and third and fourth beams 54, 56 of second spring system 26 are located at rotational axis 38 with a longitudinal dimension 88 of each of first, second, third, and fourth beams 44, 46, 54, 56 being aligned with rotational axis 38, and therefore parallel to X-axis 30.

As will be discussed in greater detail below, first and second spring systems 24, 26 facilitate translational motion of proof mass 22. This translational motion includes motion in a first direction, referred to herein as an X-direction 90 parallel to X-axis 30 and motion in a second direction, referred to herein as a Y-direction 92 parallel to Y-axis 32. This translational motion of proof mass 22 is used to detect acceleration in the corresponding X-direction 90 and Y-direction 92 substantially parallel to surface 27 of substrate 28. First and second spring systems 24, 26 additionally facilitate teeter-totter like rotation of proof mass 22 about rotational axis 38. The asymmetric mass and rotation about rotational axis 38 enables proof mass 22 to detect acceleration in a third direction, referred to herein as a Z-direction 94 parallel to Z-axis 34 and orthogonal to surface 27 of substrate 28.

MEMS inertial sensor 20 further includes first electrodes 96, second electrodes 98, and third electrodes 100. As mentioned previously, MEMS device 20 is configured to determine the force applied by acceleration in any of three orthogonal directions (i.e., X-direction 90, Y-direction 92, and Z-direction 94 as defined by the corresponding X-axis 30, Y-axis 32, and Z-axis 34). First and second electrodes 96 and 98, respectively, are coupled to surface 27 of substrate 28 and can be disposed in openings extending through proof mass 22. First electrodes 96 are used to detect acceleration in X-direction 90 as a change in capacitance between first electrodes 96 and proof mass 22. Similarly, second electrodes 98 are used to detect acceleration in Y-direction 92 as a change in capacitance between second electrodes 98 and proof mass 22. First and second electrodes 96, 98 may be positioned as close to rotational axis 38 as possible in order to minimize the cross coupling of sense signals between rotational motion of proof mass 22 and displacements of proof mass 22 in X-direction 90 and/or Y-direction 92.

Again, the motion of proof mass 22 is additionally based upon a teeter-totter principal of operation for differential signal evaluation in order to detect acceleration in Z-direction 94 substantially parallel to Z-axis 34. Accordingly, third electrodes 100 are formed on surface 27 of substrate 28 underlying proof mass 22 on opposing sides of rotational axis 38. Third electrodes 100 are used to detect acceleration in Z-direction 94 as a change in capacitance between third electrodes 100 and proof mass 22. Third electrodes 100 may be positioned as far away from rotational axis 38 as possible, and may be displaced away from rotational axis 38 by an equivalent distance. The displaced position of third electrodes 100 can result in greater gap width changes as proof mass 22 rotates, relative to locations that are closer to rotational axis 38, so as to yield relatively high changes in capacitance and thereby enhanced sensitivity.

Figure 3:
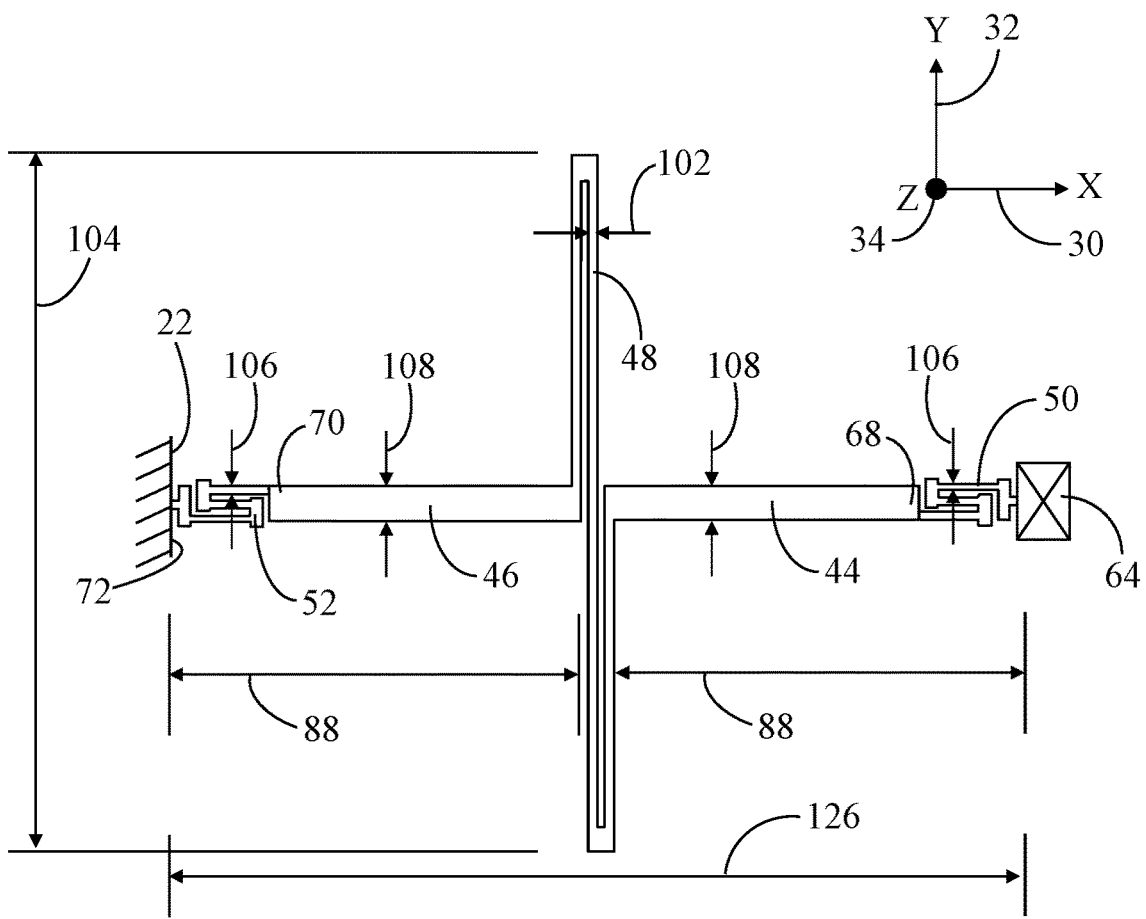
FIG. 3 shows an enlarged top view of a spring system implemented within the MEMS inertial sensor of FIG. 1.

FIG. 3 shows an enlarged top view of first spring system 24 implemented within MEMS inertial sensor 20 (FIG. 1). The following discussion is provided in connection with first spring system 24. However, it should be understood that the following discussion applies equivalently to second spring system 26 in which third beam 54 corresponds with first beam 44, fourth beam 56 corresponds with second beam 46, second center flexure 58 corresponds with first center flexure 48, third end flexure 60 corresponds with first end flexure 50, and fourth end flexure 62 corresponds with second end flexure 52.

First center flexure 48 is interposed between first and second beams 44, 46, with first and second beams 44, 46 having substantially the same longitudinal dimension 88. A configuration in which first and second beams 44, 46 are the same length and first and second end flexures 50, 52 are generally identical, places first center flexure 48 centrally located between first anchor 64 and first edge 72 of proof mass 22. At this central location, there is little to no bending moment under loading in either of the Y-direction 92 and Z-direction 94. That is, by placing first center flexure 48 at this central location, there is very little deformation of first center flexure 48 under loading in either of the Y-direction 92 and Z-direction 94. This configuration yields a high spring constant along Z-axis 34 to prevent or largely limit a common-mode "sag" in Z-direction 94 that might otherwise adversely affect non-linearity and reduce restoring force.

First end flexure 50 is interconnected between first beam end 68 of first beam 44 and first anchor 64 and second end flexure 52 is interconnected between second beam end 70 of second beam 46 and proof mass 22. In the illustrated configuration, first center flexure 48 may be a folded beam (e.g., spring element) having a first beam width 102 and a spring length 104. Similarly, each of first and second end flexures 50, 52 may be folded beams (e.g., spring elements) having a second beam width 106. First and second beams 44, 46 are generally straight beams and have a third beam width 108. Third beam width 108 is greater than first and second beams widths 104, 106. Thus, first and second beams 44, 46 are rigid relative to first and second end flexures 50, 52 and first center flexure 48 such that they have very little deformation when subjected to acceleration forces in any of the three orthogonal directions.

Figure 4:
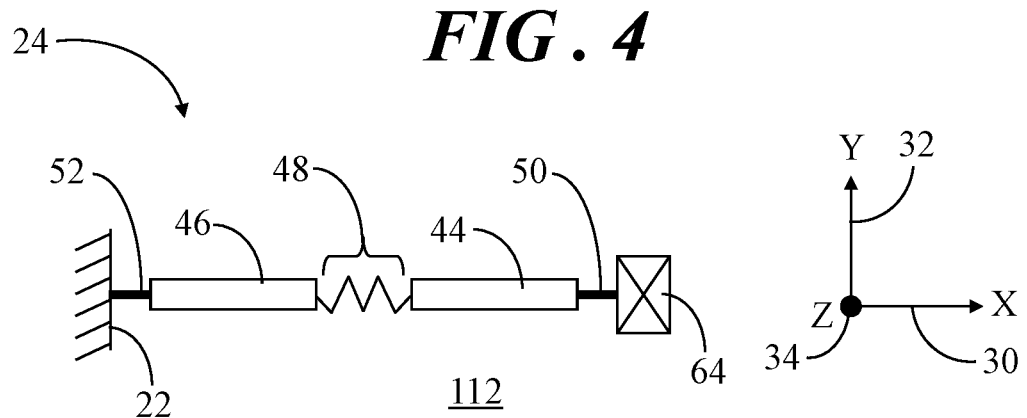
FIG. 4 shows a representative top view of the spring system of FIG. 3 in response to an acceleration force in a first direction.

Referring now to FIG. 4, FIG. 4 shows a representative top view of first spring system 24 in response to a first acceleration force 110, labeled $A_X$, in X-direction 90. Again, the following discussion applies equivalently to second spring system 26 (FIG. 1). FIG. 4 shows a first representative model 112 of first spring system 24 that is not being subjected to first acceleration force 110 and a second representative model 114 of first spring system 24 being subjected to first acceleration force 110 in X-direction 90. In the images of FIG. 4, first and second end flexures 50, 52 (FIG. 3) are represented by simple beam models and first center flexure 48 is represented by a simple tension/expansion spring model.

First spring system 24 is configured to facilitate translational motion, represented by an arrow 116, of proof mass 22 relative to first anchor 64 and substantially parallel to surface 27 (FIG. 3) of substrate 28 (FIG. 3) in order to sense first acceleration force 110 in X-direction 90. First beam width 102 (FIG. 3) and spring length 104 (FIG. 3) of first center flexure 48 can provide suitable flexibility for translational motion 116 in response to first acceleration force 110 in X-direction 90. This translational motion is therefore referred to hereinafter as X-axis translational motion 116. As shown in second representative model 114, first center flexure 48 is flexible in X-direction 90 to enable X-axis translational motion 114 of proof mass 22 in X-direction 90 in response to first acceleration force 110. However, first and second beams 44, 46 and first and second end flexures 50, 52 are stiff in X-direction 90 relative to first center flexure 48. Thus, nearly all compliance in X-direction 90 is provided by first center flexure 48. In one example, first beam width 102 may be approximately 2 microns and spring length 104 may be approximately 150 microns to yield an 8 N/m (Newton per meter) spring constant, Kx, of first center flexure 48. However, alternative embodiments may implement different beam widths 102 and spring lengths 104 and more or less folds of the folded beam structure to yield the desired compliance in X-direction 90.

Figure 5:
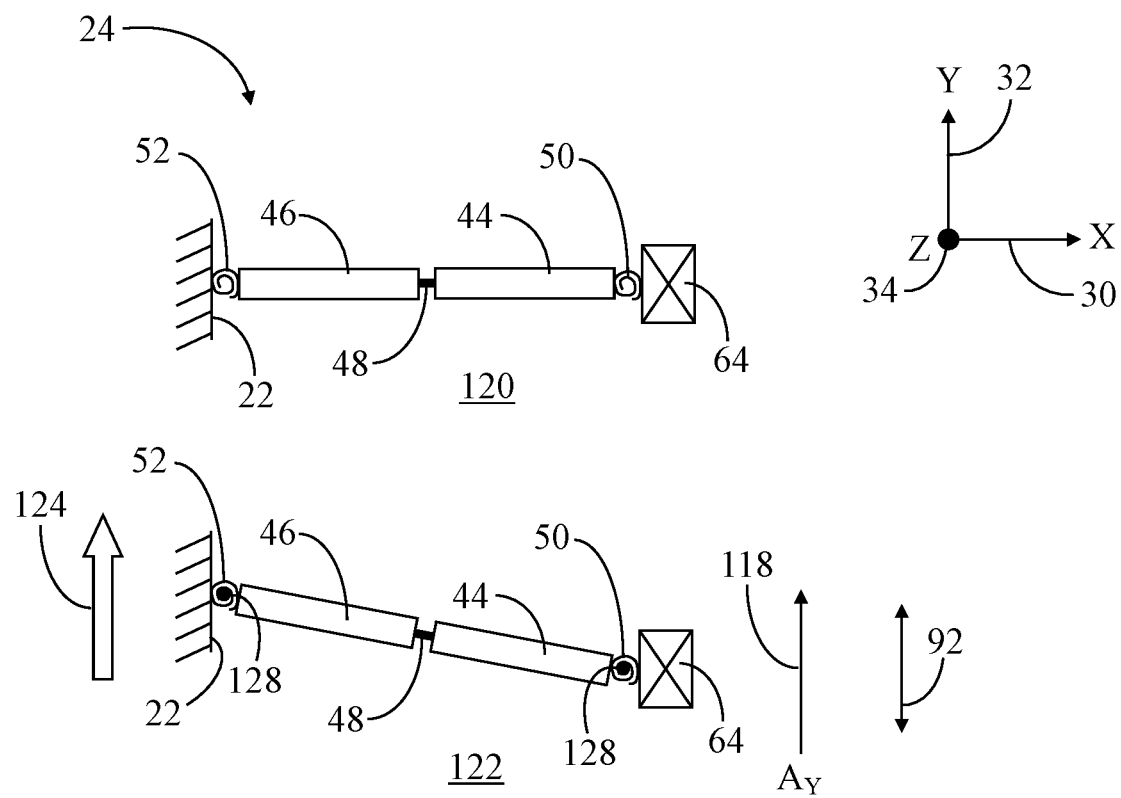
FIG. 5 shows a representative top view of the spring system of FIG. 3 in response to an acceleration force in a second direction.

FIG. 5 shows a representative top view of first spring system 24 (FIG. 3) in response to a second acceleration force 118, labeled $A_Y$, in Y-direction 92. Again, the following discussion applies equivalently to second spring system 26. FIG. 5 shows a first representative model 120 of first spring system 24 that is not being subjected to second acceleration force 118 and a second representative model 122 of first spring system 24 being subjected to second acceleration force 118 in Y-direction 92. In the images of FIG. 5, first and second end flexures 50, 52 (FIG. 3) are represented by simple torsion models and first center flexure 48 is represented by a simple beam model.

First spring system 24 is configured to facilitate translational motion, represented by an arrow 124, of proof mass 22 relative to first anchor 64 and substantially parallel to surface 27 (FIG. 3) of substrate 28 (FIG. 3) in order to sense second acceleration force 118 in Y-direction 92. More particularly, a combined function of first and second spring systems 24, 26 enables translational motion in Y-direction 92 relative to the respective first and second anchors 64, 66 (FIG. 1) in response to second acceleration force 118. First and second end flexures 50, 52 and a beam length 126 (see FIG. 3) between first anchor 64 and proof mass 22 can provide suitable flexibility for translational motion 124 in response to second acceleration force 118 in Y-direction 92. This translational motion is therefore referred to hereinafter as Y-axis translational motion 124. As shown in second representative model 122, first and second end flexures 50, 52 enable in-plane (Z-axis) rotational flexure such that each of first and second end flexures 50, 52 rotate about an axis of rotation 128 perpendicular to surface 27 (FIG. 3) of substrate 28 (FIG. 3).

First and second beams 44, 46 do not flex significantly in response to second acceleration force 118. First center flexure 48 is compliant in X-direction 90 as discussed in connection with FIG. 4, but has a near zero bending moment. Thus, first and second beams 44, 46 and first center flexure 48 do not contribute significantly to the flexibility of first spring system 24 in response to second acceleration force 118 in Y-direction 92. Accordingly, a spring constant, $K_Y$, in Y-direction 92 is approximately proportional to the z-axis rotational stiffness, $K_{RZ}$, about axis of rotation 128 of first and second end flexures 50, 52 and inversely proportional to the square of beam length 126, LB, as follows:

$$K_Y \approx \frac{K_{RZ}}{L_B^2} \quad (1)$$

In one example, the spring constant, $K_Y$, may be approximately 8 N/m. However, alternative embodiments may implement different beam widths 106 (FIG. 3) and more or less folds of the folded beam structure of first and second end flexures 50, 52 to yield the desired compliance in Y-direction 92.

Figure 6:
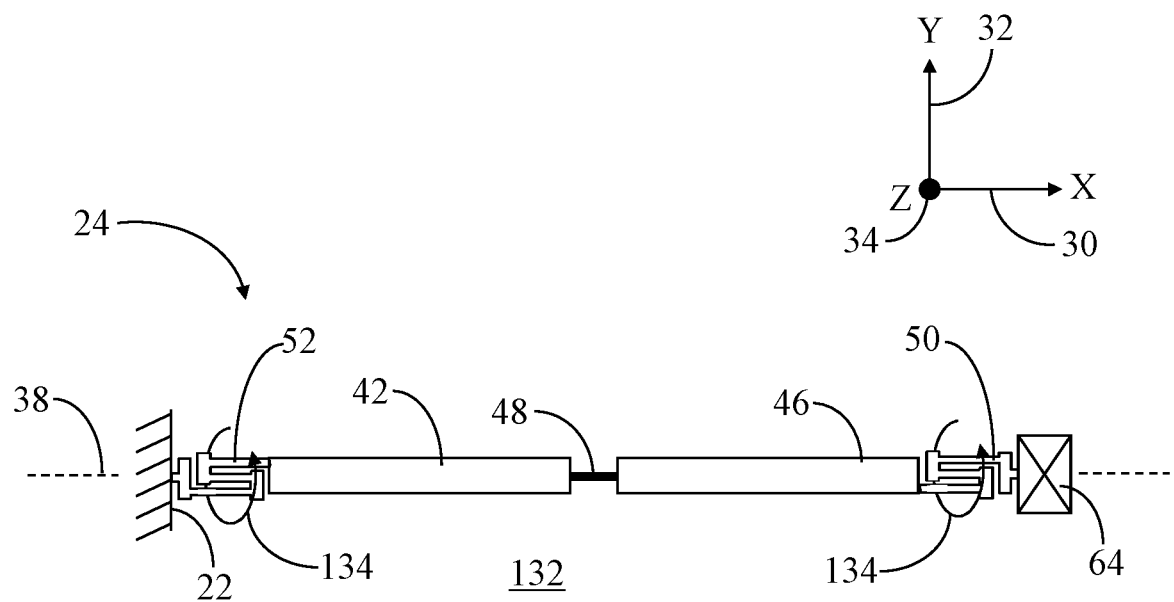
FIG. 6 shows a representative top view of the spring system of FIG. 3 in response to an acceleration force in a third direction.
Figure 7:
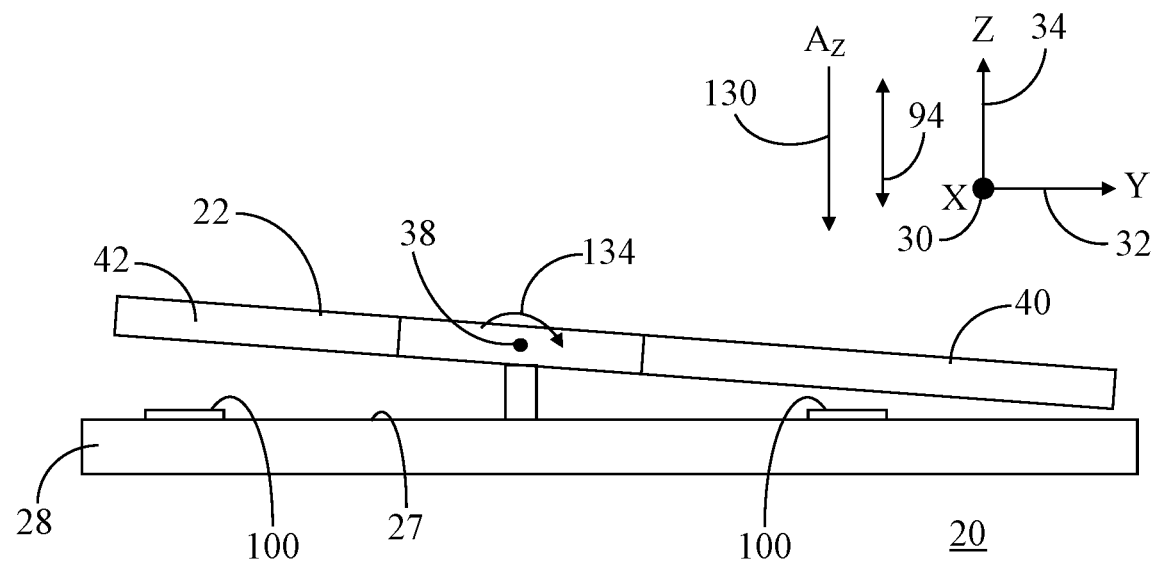
FIG. 7 shows a representative side view of the spring system of FIG. 3 in response to the acceleration force in the third direction.

Referring to FIGS. 6 and 7, FIG. 6 shows a representative top view of first spring system 24 (FIG. 3) in response to a third acceleration force and FIG. 7 shows a representative side view of inertial sensor 20 in response to a third acceleration force 130, labeled $A_Z$, in Z-direction 94. Again, the following discussion applies equivalently to second spring system 26 (FIG. 1). FIG. 6 shows a representative model 132 of first spring system 24 being subjected to third acceleration force 130 in Z-direction 94 and FIG. 7 demonstrates the rotational motion of proof mass 22 about rotational axis 38 in response to third acceleration force 130. In the image of FIG. 5, first center flexure 48 is represented by a simple beam model.

First spring system 24 is further configured to facilitate rotational motion, represented by a curved arrow 134 in FIGS. 6 and 7, of proof mass 22 about rotational axis 38 in response to third acceleration force 130 in Z-direction 94. Torsional flexibility occurs primarily at first and second end flexures 50, 52 so that first and second end flexures 50, 52 facilitate the rotational (e.g., teeter totter) motion of proof mass 22 about rotational axis 38 in order to sense third acceleration force 130. First and second beams 40, 42 and first center flexure 48 are resistant to torsional deformation about rotational axis 38 relative to first and second end flexures 50, 52. Thus, first and second beams 40, 42 and first center flexure 48 do not contribute significantly to the flexibility of first spring system 24 in response to third acceleration force 130 in Z-direction 94. In one example, an X-axis rotational spring constant (e.g., about rotational axis 38 aligned with X-axis 30) may be approximately 2.7E-7 N*m per radian. However, alternative embodiments may implement different beam widths 106 (FIG. 6) and more or less folds of the folded beam structure of first and second end flexures 50, 52 to yield the desired compliance about rotational axis 38 in response to acceleration force 130 in Z-direction 94.

Accordingly, the design of first and second spring systems 24, 26 can provide the useful spring constants for sensing acceleration forces in each of three orthogonal directions using a single proof mass. Further, the desired spring constants can be achieved while greatly increasing stiffness along the Z-axis as compared to prior art designs. The increased stiffness along the Z-axis improves linearity and restoring force. Still further, the configuration of first and second spring systems 24, 26 enables the implementation of a two spring system in lieu of prior art four spring systems, thereby achieving reductions in the area of such a MEMS inertial sensor relative to prior art designs.

Figure 8:
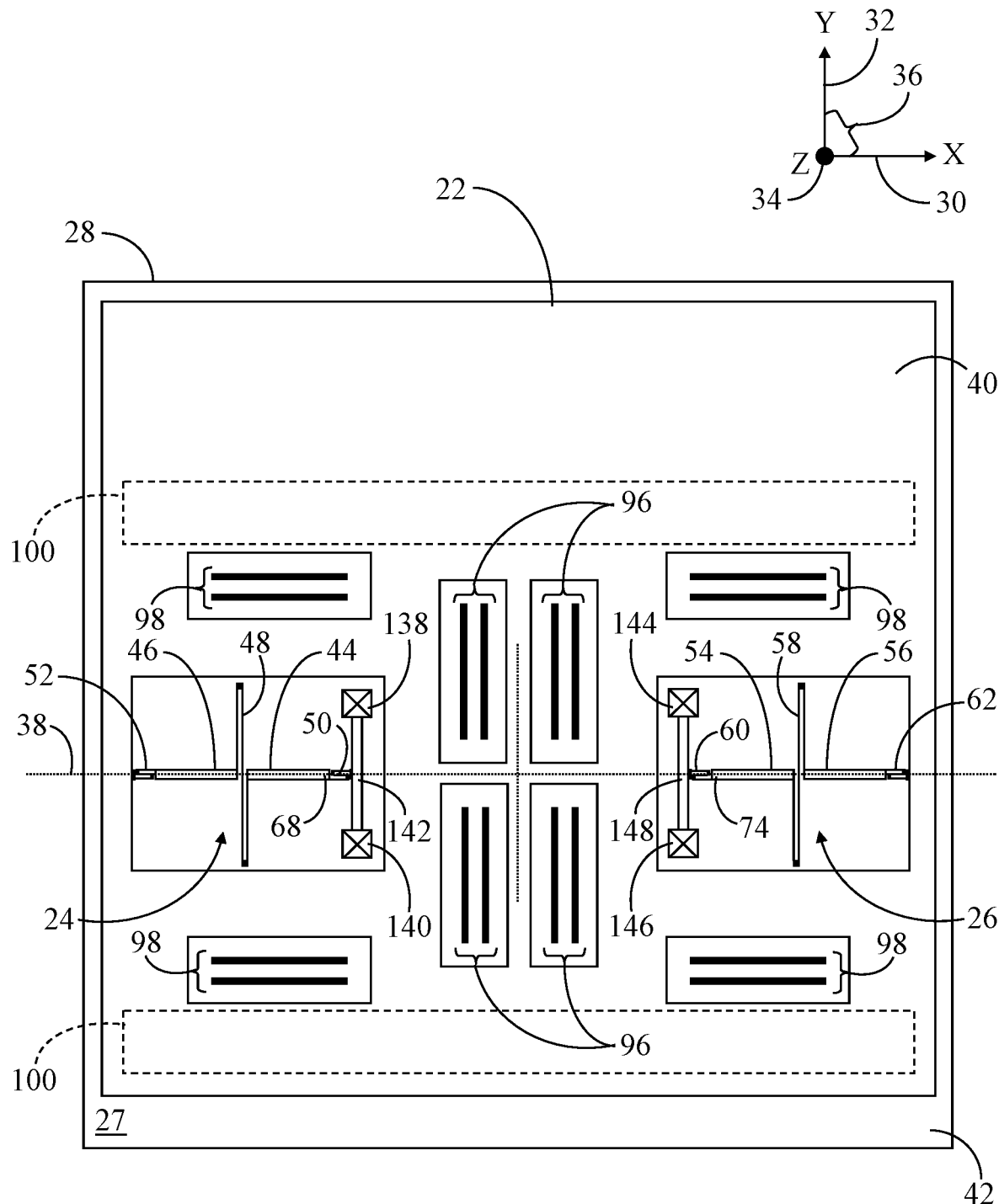
FIG. 8 shows a schematic top view of a MEMS inertial sensor in accordance with another embodiment.

Referring now to FIG. 8, FIG. 8 shows a schematic top view of a MEMS inertial sensor 136 in accordance with another embodiment. MEMS inertial sensor 136 has many of the same structures as MEMS inertial sensor 20 of FIG. 1. Hence, the same reference numbers will be used in association with inertial sensor 136 for the same structures also in inertial sensor 20. Inertial sensor 136 generally includes proof mass 22, and first and second spring systems 24, 26 spaced apart from and configured to movably couple proof mass 22 to surface 27 of substrate 28.

Inertial sensor 136 further includes first and second anchors 138, 140 attached to surface 27 of substrate 28. A first interconnection beam 142 is suspended above surface 27 of substrate 28 and is coupled to each of first and second anchors 138, 140. First interconnection beam 142 is arranged orthogonal to first beam 44 of first spring system 24 and first end flexure 50 of first spring system 24 is coupled to first end 68 of first beam 44 and to first interconnection beam 142. Additionally, inertial sensor 136 includes third and fourth anchors 144, 146 attached to surface 27 of substrate 28. A second interconnection beam 148 is suspended above surface 27 of substrate 28 and is coupled to each of third and fourth anchors 138, 140. Second interconnection beam 148 is arranged orthogonal to third beam 54 of second spring system 26 and third end flexure 60 of second spring system 26 is coupled to third end 74 of third beam 54 and to second interconnection beam 148.

Thus, each of first and second spring systems 24, 26 is suspended over surface 27 of substrate 28 via two anchors (e.g., first and second anchors 138, 140 for first spring system 24 and third and fourth anchors 144, 146 for second spring system 26). The anchor configuration of inertial sensor 136 may yield improvements in system performance due to internal stresses resulting from thermal expansion, while still providing the useful spring constants, increased stiffness along the Z-axis for improved linearity and restoring force, and area reductions of the MEMS inertial sensor.

Embodiments described herein entail microelectromechanical systems (MEMS) inertial sensor devices. An embodiment of an inertial sensor comprises a movable element spaced apart from a surface of a substrate, an anchor attached to the substrate, and a spring system spaced apart from the surface of the substrate and configured to movably couple the movable element to the substrate. The spring system comprises a first beam, a second beam, a center flexure interposed between the first and second beams, a first end flexure interconnected between a first end of the first beam and the anchor, and a second end flexure interconnected between a second end of the second beam and an edge of the movable element, wherein the first and second beams are resistant to deformation relative to the center flexure and the first and second end flexures.

Another embodiment of an inertial sensor comprises a movable element spaced apart from a surface of a substrate, the movable mass having a mass that is asymmetric relative to a rotational axis, an anchor attached to the substrate, and a spring system spaced apart from the surface of the substrate and configured to movably couple the movable element to the substrate. The spring system comprises a first beam, a second beam, a center flexure interposed between the first and second beams, a first end flexure interconnected between a first end of the first beam and the anchor, and a second end flexure interconnected between a second end of the second beam and an edge of the movable element. The first and second beams are located at the rotational axis with a longitudinal dimension of the first and second rigid beams being aligned with the rotational axis. The first and second beams are resistant to deformation relative to the center flexure and the first and second end flexures. The spring system is configured to facilitate translational motion relative to the substrate in a first direction parallel to a first axis in response to a first force that is parallel to the first axis and in a second direction parallel to a second axis in response to a second force that is parallel to the second axis, the first and second axes being substantially parallel to the surface of the substrate, and the second axis being substantially orthogonal to the first axis. The spring system is configured to facilitate rotational motion of the movable element about the rotational axis in response to a third force along a third axis that is perpendicular to a surface of the substrate, and the rotational motion of the movable element about the rotational axis comprises rotation about the first axis.

Another embodiment of an inertial sensor comprises a movable element spaced apart from a surface of a substrate, the movable mass having a mass that is asymmetric relative to a rotational axis, a first anchor attached to the substrate, and a second anchor attached to the substrate. A first spring system is spaced apart from the surface of the substrate. The first spring system comprises a first beam, a second beam, a first center flexure interposed between the first and second beams, a first end flexure interconnected between a first end of the first beam and the anchor, and a second end flexure interconnected between a second end of the second beam and a first edge of the movable element, wherein the first and second beams are resistant to deformation relative to the first center flexure and the first and second end flexures. A second spring system is spaced apart from the surface of the substrate. The second spring system comprises a third beam, a fourth beam, a second center flexure interposed between the third and fourth beams, a third end flexure interconnected between a third end of the third beam and the second anchor, and a fourth end flexure interconnected between a fourth end of the fourth beam and a second edge of the movable element, wherein the third and fourth beams are resistant to deformation relative to the second center flexure and the third and fourth end flexures, and the third and fourth beams are located at the rotational axis with the longitudinal dimension of the third and fourth rigid beams being aligned with the rotational axis. The first and second spring systems are configured to facilitate rotational motion of the movable element about the rotational axis and the first and second spring systems are further configured to facilitate translational motion of the movable element substantially parallel to the surface of the substrate.

The MEMS inertial sensor devices can include MEMS accelerometer devices capable of sensing acceleration in three orthogonal directions (e.g., X-direction, Y-direction, and Z-direction) defined by three orthogonal axes (e.g., X-axis, Y-axis, and Z-axis). In general, the inertial sensors can provide relatively small device size by facilitating the sharing of a single proof mass for sensing in all three directions. Furthermore, the inertial sensors can provide this relatively small device size while still yielding improvements in linearity and restoring force when subjected to high impact loads. These improvements can be provided by the use of two spring systems having useful spring constants in each of three orthogonal directions and having enhanced Z-axis translational stiffness.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An inertial sensor comprising:
    a movable element spaced apart from a surface of a substrate;
    an anchor attached to the substrate; and
    a spring system spaced apart from the surface of the substrate and configured to movably couple the movable element to the substrate, the spring system comprising:
        a first beam;
        a second beam;
        a center flexure interposed between the first and second beams;
        a first end flexure interconnected between a first end of the first beam and the anchor; and
        a second end flexure interconnected between a second end of the second beam and an edge of the movable element, wherein the first and second beams are resistant to deformation relative to the center flexure and the first and second end flexures.

2. The inertial sensor of claim 1 wherein:
    the movable element has a mass that is asymmetric relative to a rotational axis;
    the spring system is configured to facilitate rotational motion of the movable element about the rotational axis; and
    the spring system is further configured to facilitate translational motion of the movable element substantially parallel to the surface of the substrate.

3. The inertial sensor of claim 2 wherein:
    the translational motion of the movable element relative to the substrate is in a first direction parallel to a first axis in response to a first force that is parallel to the first axis and in a second direction parallel to a second axis in response to a second force that is parallel to the second axis, the first and second axes being substantially parallel to the surface of the substrate, and the second axis being substantially orthogonal to the first axis;
    the rotational motion of the movable element about the rotational axis is in response to a third force along a third axis that is perpendicular to the surface of the substrate; and
    the rotational motion of the movable element about the rotational axis comprises rotation about the first axis.

4. The inertial sensor of claim 3 wherein the center flexure is flexible in the first direction to enable the translational motion of the movable element in the first direction in response to the first force.

5. The inertial sensor of claim 4 wherein the first and second beams and the first and second end flexures are stiff in the first direction relative to the center flexure.

6. The inertial sensor of claim 3 wherein the first and second end flexures are flexible in the second direction to enable the translational motion of the movable element in the second direction in response to the second force.

7. The inertial sensor of claim 6 wherein the first and second beams and the center flexure are stiff in the second direction relative to the first and second end flexures.

8. The inertial sensor of claim 3 wherein the first and second end flexures are configured to facilitate the rotational motion of the movable element about the rotational axis in response to the third force.

9. The inertial sensor of claim 8 wherein the first and second beams and the center flexure are resistant to deformation about the rotational axis relative to the first and second end flexures.

10. The inertial sensor of claim 1 wherein the spring system is configured to facilitate rotational motion of the movable element about the rotational axis in response to a force that is perpendicular to a surface of the substrate, and the first and second beams of the spring system are located at the rotational axis with a longitudinal dimension of the first and second rigid beams being aligned with the rotational axis.

11. The inertial sensor of claim 10 wherein the spring system is a first spring system, and the inertial sensor further comprises a second spring system configured to movably couple the movable element to the substrate, the second spring system comprising:
a third beam;
a fourth beam;
a second center flexure interposed between the third and fourth beams;
a third end flexure interconnected between a third end of the third beam and a second anchor attached to the substrate; and
a fourth end flexure interconnected between a fourth end of the fourth beam and a second edge of the movable element, wherein the third and fourth beams are resistant to deformation relative to the second center flexure and the third and fourth end flexures, and the third and fourth beams are located at the rotational axis with the longitudinal dimension of the third and fourth rigid beams being aligned with the rotational axis.

12. The inertial sensor of claim 11 wherein the first and second spring systems are laterally disposed on opposing sides of a center point of the rotational axis by an equivalent distance.

13. The inertial sensor of claim 1 wherein the anchor is a first anchor, and the inertial sensor further comprises:
a second anchor attached to the substrate; and
a first interconnection beam suspended above the surface of the substrate and coupled to each of the first and second anchors, the first interconnection beam being arranged orthogonal to the first beam, and the first end flexure is coupled to the first end of the first beam and the first interconnection beam such that the first end flexure is interconnected to each of the first and second anchors via the first interconnection beam.

14. An inertial sensor comprising:
a movable element spaced apart from a surface of a substrate, the movable element having a mass that is asymmetric relative to a rotational axis;
an anchor attached to the substrate; and
a spring system spaced apart from the surface of the substrate and configured to movably couple the movable element to the substrate, the spring system comprising a first beam, a second beam, a center flexure interposed between the first and second beams, a first end flexure interconnected between a first end of the first beam and the anchor, and a second end flexure interconnected between a second end of the second beam and an edge of the movable element, wherein:
the first and second beams are located at the rotational axis with a longitudinal dimension of the first and second rigid beams being aligned with the rotational axis;
the first and second beams are resistant to deformation relative to the center flexure and the first and second end flexures;
the spring system is configured to facilitate translational motion relative to the substrate in a first direction parallel to a first axis in response to a first force that is parallel to the first axis and in a second direction parallel to a second axis in response to a second force that is parallel to the second axis, the first and second axes being substantially parallel to the surface of the substrate, and the second axis being substantially orthogonal to the first axis;
the spring system is configured to facilitate rotational motion of the movable element about the rotational axis in response to a third force along a third axis that is perpendicular to a surface of the substrate; and
the rotational motion of the movable element about the rotational axis comprises rotation about the first axis.

15. The inertial sensor of claim 14 wherein:
the center flexure is flexible in the first direction to enable the translational motion of the movable element in the first direction in response to the first force; and
the first and second beams and the first and second end flexures are stiff in the first direction relative to the center flexure.

16. The inertial sensor of claim 14 wherein:
the first and second end flexures are flexible in the second direction to enable the translational motion of the movable element in the second direction in response to the second force; and
the first and second beams and the center flexure are stiff in the second direction relative to the first and second end flexures.

17. The inertial sensor of claim 14 wherein:
the first and second end flexures are configured to facilitate the rotational motion of the movable element about the rotational axis in response to the third force; and
the first and second beams and the center flexure are resistant to deformation about the rotational axis relative to the first and second end flexures.

18. An inertial sensor comprising:
a movable element spaced apart from a surface of a substrate, the movable element having a mass that is asymmetric relative to a rotational axis;
a first anchor attached to the substrate;
a second anchor attached to the substrate;
a first spring system spaced apart from the surface of the substrate, the first spring system comprising a first beam, a second beam, a first center flexure interposed between the first and second beams, a first end flexure interconnected between a first end of the first beam and the anchor, and a second end flexure interconnected between a second end of the second beam and a first edge of the movable element, wherein the first and second beams are resistant to deformation relative to the first center flexure and the first and second end flexures; and
second spring system spaced apart from the surface of the substrate comprising a third beam, a fourth beam, a second center flexure interposed between the third and fourth beams, a third end flexure interconnected between a third end of the third beam and the second anchor, and a fourth end flexure interconnected between a fourth end of the fourth beam and a second edge of the movable element, wherein the third and fourth beams are resistant to deformation relative to the second center flexure and the third and fourth end flexures, and the third and fourth beams are located at the rotational axis with the longitudinal dimension of the third and fourth rigid beams being aligned with the rotational axis, wherein the first and second spring systems are configured to facilitate rotational motion of the movable element about the rotational axis and the first and second spring systems are further configured to facilitate translational motion of the movable element substantially parallel to the surface of the substrate.

19. The inertial sensor of claim 18 wherein:
the translational motion of the movable element relative to the substrate is in a first direction parallel to a first axis in response to a first force that is parallel to the first axis and in a second direction parallel to a second axis in response to a second force that is parallel to the second axis, the first and second axes being substantially parallel to the surface of the substrate, and the second axis being substantially orthogonal to the first axis;
the rotational motion of the movable element about the rotational axis is in response to a third force along a third axis that is perpendicular to the surface of the substrate; and
the rotational motion of the movable element about the rotational axis comprises rotation about the first axis.

20. The inertial sensor of claim 18 wherein the inertial sensor further comprises:
a third anchor attached to the substrate;
a fourth anchor attached to the substrate;
a first interconnection beam suspended above the surface of the substrate and coupled to each of the first and third anchors, the first interconnection beam being arranged orthogonal to the first beam, and the first end flexure is coupled to the first end of the first beam and the first interconnection beam such that the first end flexure is interconnected to each of the first and third anchors via the first interconnection beam; and
a second interconnection beam suspended above the surface of the substrate and coupled to each of the second and fourth anchors, the second interconnection beam being arranged orthogonal to the third beam, and the third end flexure is coupled to the third end of the third beam and the second interconnection beam such that the third end flexure is interconnected to each of the second and fourth anchors via the second interconnection beam.

* * * * *